(12) United States Patent
Asahi

(10) Patent No.: US 8,405,473 B2
(45) Date of Patent: Mar. 26, 2013

(54) VARIABLE FREQUENCY RESONATOR

(75) Inventor: Yasuaki Asahi, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 269 days.

(21) Appl. No.: 12/845,150

(22) Filed: Jul. 28, 2010

(65) Prior Publication Data

US 2011/0128093 A1 Jun. 2, 2011

(30) Foreign Application Priority Data

Dec. 2, 2009 (JP) ................................. 2009-274508

(51) Int. Cl.
*H03H 7/01* (2006.01)
*H01P 7/10* (2006.01)

(52) U.S. Cl. ...................... 333/174; 333/185; 333/219.1

(58) Field of Classification Search .................. 333/174, 333/175, 185, 219, 219.1
See application file for complete search history.

(56) References Cited

U.S. PATENT DOCUMENTS

| | | | | |
|---|---|---|---|---|
| 2,661,459 A | * | 12/1953 | Schmidt, Jr. ................. | 333/174 |
| 3,909,751 A | * | 9/1975 | Tang et al. .................... | 333/103 |
| 6,466,114 B1 | * | 10/2002 | Alexandersson ............... | 334/14 |
| 6,504,443 B1 | * | 1/2003 | Eguizabal ................. | 331/177 V |
| 2009/0315643 A1 | * | 12/2009 | Yamakawa et al. .......... | 333/174 |

FOREIGN PATENT DOCUMENTS

JP 2004-207825 7/2004

* cited by examiner

*Primary Examiner* — Robert Pascal
*Assistant Examiner* — Kimberly Glenn
(74) *Attorney, Agent, or Firm* — Oblon, Spivak, McClelland, Maier & Neustadt, L.L.P.

(57) ABSTRACT

A variable frequency resonator includes a series resonance circuit and a parallel resonance circuit. The series resonance circuit includes a first inductor, a first capacitor and a variable capacitance diode which are connected together in series. A reverse bias voltage is applied to the variable capacitance diode. A signal source is connected to the series resonance circuit. The parallel resonance circuit includes a second inductor and a second capacitor which are connected together in parallel. One terminal of the parallel resonance circuit is connected to a connection point between the first inductor and the first capacitor, and the other terminal of the parallel resonance circuit is connected to a connection point between the variable capacitor and the one terminal of the signal source.

7 Claims, 4 Drawing Sheets

VARIABLE FREQUENCY RESONATOR

CROSS-REFERENCE TO RELATED APPLICATION

This application is based upon and claims the benefit of priority from the prior Japanese Patent Application No. 2009-274508, filed on Dec. 2, 2009, the entire contents of which are incorporated herein by reference.

FIELD

An embodiment of the invention described herein generally relates to a variable frequency resonator.

BACKGROUND

A variable capacitance diode termed as a varicap diode or a varactor diode is often used to vary a capacitance by controlling a voltage applied to the diode. When a reverse bias voltage is applied, the variable capacitance diode is able to vary the junction capacitance by varying the thickness of the depletion layer in the p-n junction. The variable capacitance diode is highly reliable because the variable capacitance diode includes no mechanical elements. For this reason, variable capacitance diodes are widely used in voltage-controlled oscillators and voltage-controlled variable filters. Variable capacitance diodes are components essential for television receiver sets, cellular phones and the like.

A variable capacitance diode, however, has a low Q factor (quality factor), and the Q factor largely varies depending on a reverse bias voltage applied to the variable capacitance diode. The Q factor is decreased depending on internal resistance of the variable capacitance diode.

In addition, a variable frequency resonator generally uses a variable capacitance diode as a capacitor of the resonator which includes an inductor and the capacitor. Decrease in the Q factor of the variable capacitance diode results in decrease in the Q factor of the resonator. When a resonator is used in an oscillator, the resonator with a lower Q factor deteriorates the phase noise characteristic of an oscillated signal. For this reason, resonators in use for measurement and communications, for instance, are required to have a higher Q factor.

Two open-end strip line resonators having different electrical lengths are known to be connected in parallel to a bias supply point of a variable capacitance diode in order to achieve satisfactory phase noise characteristic, for example (see Japanese Patent Application Publication No. 2008-277938).

BRIEF DESCRIPTION OF THE INVENTION

DETAILED DESCRIPTION

According to the embodiment, a variable frequency resonator has a series resonance circuit and a parallel resonance circuit. The series resonance circuit includes a first inductor having a first terminal connected to one end of a signal source and having a second terminal; a first capacitor having a third terminal connected to the second terminal and having a fourth terminal; and a variable capacitance diode to which a reverse bias voltage is applied having a fifth terminal connected to the fourth terminal and having a sixth terminal connected to the other end of the signal source. The parallel resonance circuit includes a second inductor having a seventh terminal and an eighth terminal; and a second capacitor having a ninth terminal connected to the seventh terminal and having a tenth terminal connected to the eighth terminal. A connecting point between the seventh terminal and the ninth terminal is connected to a connecting point between the second terminal and the third terminal. A connecting point between the eighth terminal and the tenth terminal is connected to the sixth terminal.

Figure 1:
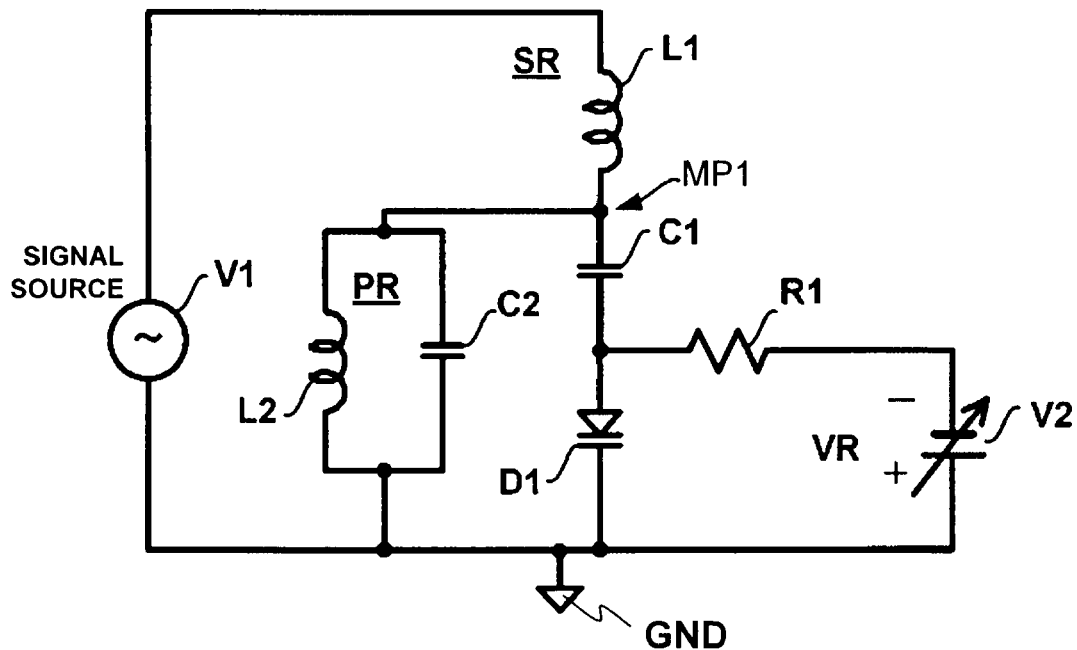
FIG. 1 is circuit diagram of a variable frequency resonator according to an embodiment.

Detailed descriptions will be provided for an embodiment with reference to the drawings. FIG. 1 is a circuit diagram of a variable frequency resonator according to the embodiment. The variable frequency resonator includes a series resonance circuit SR and a parallel resonance circuit PR.

The series resonance circuit SR includes a first inductor L1, a first capacitor C1 and a variable capacitance diode D1 which are connected together in series. One terminal of the capacitor C1 is connected to one terminal of the first inductor L1. The other terminal of the capacitor C1 is connected to an anode terminal of the variable capacitance diode D1. One terminal of a signal source V1 is connected to the other terminal of the first inductor L1. The other terminal of the signal source V1 is connected to a cathode terminal of the variable capacitance diode D1. The cathode terminal of the variable capacitance diode D1 is grounded to a ground GND such as a chassis.

One end of a controlled voltage source V2 to vary a junction capacitance of the variable capacitance diode D1 with a DC voltage is connected to the cathode terminal of the variable capacitance diode D1. The other end of the controlled voltage source V2 is connected to the anode terminal of the variable capacitance diode D1 with a resistor R1 being interposed in between. The controlled voltage source V2 applies a reverse bias voltage to the variable capacitance diode D1. The first capacitor C1 cuts the DC voltage, and thereby prevents the DC voltage from being applied to the other components.

On the other hand, the parallel resonance circuit PR includes a second inductor L2 and a second capacitor C2 which are connected together in parallel. One end of the parallel resonance circuit PR is connected to a connecting point between the first inductor L1 and the first capacitor C1. In addition, the other end of the parallel resonance circuit PR is connected to the ground GND, and is connected to the cathode terminal of the variable capacitance diode D1.

Values of the respective elements are set as follows. In the series resonance circuit SR, an inductance value of the first inductor L1 is set at 330 μH, a capacitance value of the first capacitor C1 is set at 1 μF, and a resistance value of the bias resistor R1 is set at 100 MΩ, for example. A 1SV149 of TOSHIBA Variable Capacitance Diode is used as the variable capacitance diode D1, for example.

The 1SV149 variable capacitance diode varies the capacitance from approximately 500 pF to 25 pF as a reverse bias voltage VR varies from 1V to 8V. A typical 1SV149 has a capacitance of approximately 76.8 pF when a reverse bias voltage of 4.67V is applied to the 1SV149. For this reason, when the reverse bias voltage is set at 4.67V, a series resonance frequency of the series resonance circuit SR is almost 1 MHz.

In the parallel resonance circuit PR, an inductance value of the second inductor L2 is set at 33 µH, and a capacitance value of the second capacitor C2 is set at 768 pF, for example. A parallel resonance frequency of the parallel resonance circuit PR including the second inductor L2 and the second capacitor C2 is made equal to a target frequency of the variable frequency resonator. Because the target frequency of the variable frequency resonator according to the embodiment is approximately 1 MHz, the parallel resonance frequency of the parallel resonance circuit PR is set at approximately 1 MHz. In other words, the parallel resonance frequency of the parallel resonance circuit PR is almost equal to the series resonance frequency of the series resonance circuit SR. This enhances the Q factor of the series resonance circuit SR at the target frequency, and accordingly enhances the Q factor of the variable frequency resonator.

In the case of the embodiment, a ratio of the inductance of the first inductor L1 to the inductance of the second inductance L2 is set at L1:L2=10:1. In addition, a ratio of the capacitance of the variable capacitance diode D1 to the capacitance of the second capacitor C2 is set at D1:C2=1:10. The inductance of the first inductor L1 is set larger than the inductance of the second inductor L2. Furthermore, the capacitance of the variable capacitance diode D1 is set smaller than the capacitance of the second capacitor C2.

Figure 2:
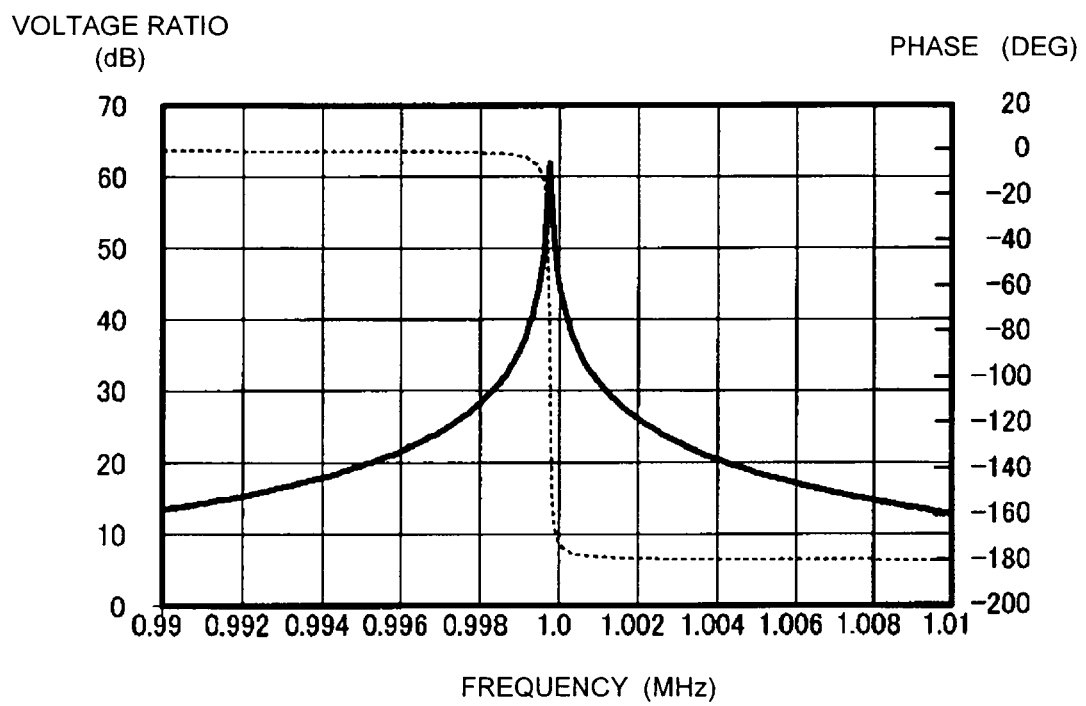
FIG. 2 shows a resonance characteristic of the variable frequency resonator according to the embodiment.

The connecting point between the inductor L1 and the capacitor C1 was chosen as a measurement point MP1. Thus, the resonance characteristic was simulated between the measurement point MP1 and the ground GND. FIG. 2 shows a resonance characteristic which the variable frequency resonator exhibited when the values of the respective elements were set as described above. In FIG. 2, the vertical axis indicates a voltage ratio expressed in decibels, and the horizontal axis indicates a frequency. A solid curve represents a voltage ratio expressed in decibels at the measurement point MP1 with respect to a signal source V1. A second axis indicates a phase expressed in angle. A dotted curve expresses a phase characteristic.

Figure 4:
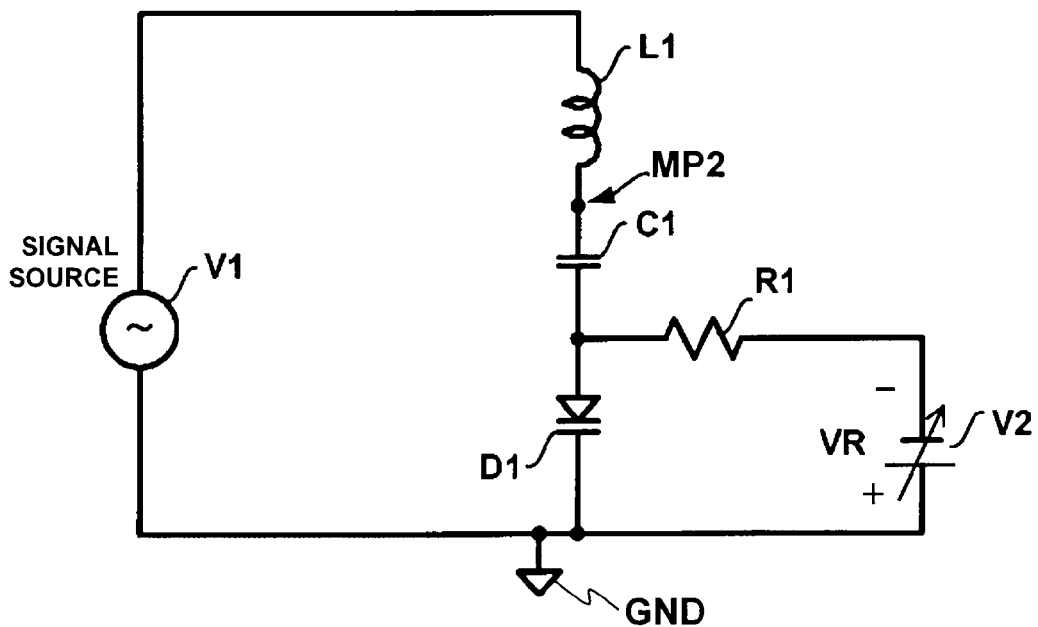
FIG. 4 is a circuit diagram of a variable frequency resonator according to a comparative example.

In this respect, the resonance characteristic of the variable frequency resonator according to the embodiment was compared with a resonance characteristic of a variable frequency series resonator including no parallel resonance circuit PR. FIG. 4 shows a circuit diagram of the variable frequency series resonator including no parallel resonance circuit PR. The variable frequency series resonator included an inductor L1, a bias-cut capacitor C1 and a variable capacitance diode D1 which were connected together in series.

Figure 5:
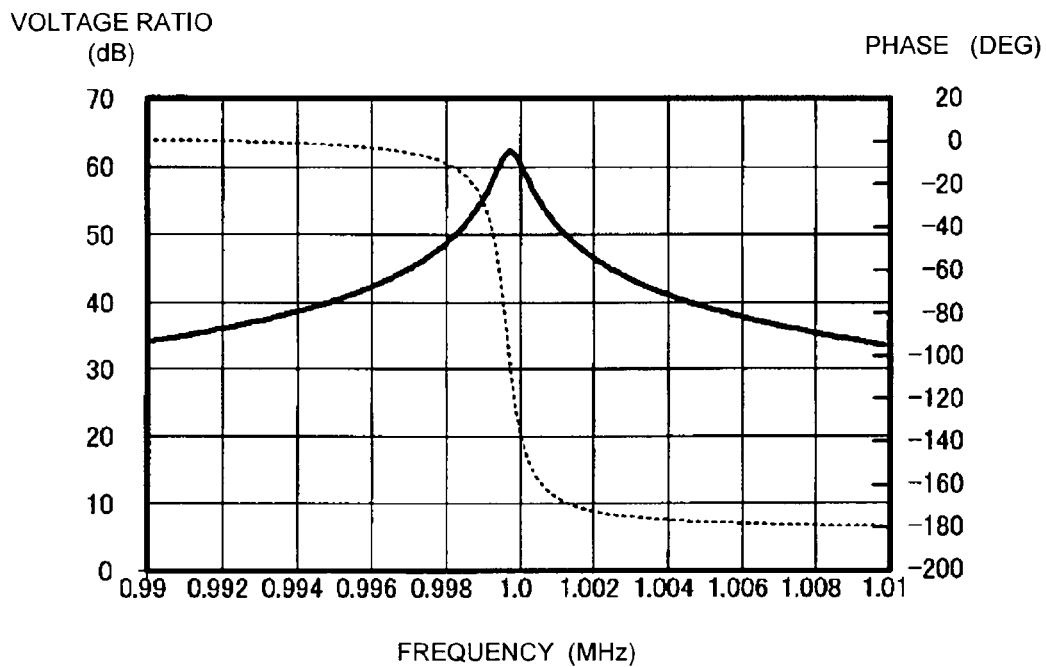
FIG. 5 shows a resonance characteristic of the variable frequency resonator according to the comparative example.

A connecting point between the inductor L1 and the capacitor C1 was chosen as a measurement point MP2. FIG. 5 shows a resonance characteristic which was simulated between the measurement point MP2 and a ground D. Values of the respective elements were set as in the case of the series resonance circuit SR according to the embodiment. In other words, an inductance value of the inductor L1 was set at 330 µH, a capacitance value of the bias-cut capacitor C1 was set at 1 µF, and a resistance value of the bias resistor R1 was set at 100 MΩ. A 1SV149 of TOSHIBA Variable Capacitance Diode was used as the variable capacitance diode D1. As a controlled voltage, a reverse bias voltage VR of 4.67V was applied to the 1SV149 from a controlled voltage source V2. In FIG. 5, a solid curve expresses a voltage ratio expressed in decibels at the measurement point MP2 with respect to a signal source V1, and a dotted curve expresses a phase characteristic.

The solid curve in FIG. 2 is steeper near the resonance frequency than the solid curve in FIG. 5. A half value width expressed by the solid curve in FIG. 2 is narrower than that expressed by the solid curve in FIG. 5. Accordingly, the Q factor of the variable frequency resonator shown in FIG. 1 was enhanced to a large extent compared to the Q factor of the variable frequency resonator shown in FIG. 4. In addition, the phase characteristic of the variable frequency resonator shown in FIG. 1 suddenly changed by 180° near the peak frequency.

The Q factor is an index value which represents decrease in energy due to a medium. The Q factor is obtained by dividing energy stored in a system by energy dissipated from the system during one period of vibration. A higher Q factor means a more stable vibration. To put it specifically, the Q factor is a dimensionless parameter expressed by the following equation.

$$Q=\Omega_0/(\Omega_2\cdot\Omega_1)$$

where $\Omega_0$ denotes a frequency at a resonance peak; $\Omega_1$ denotes a frequency at which vibration energy is equal to a half of vibration energy at a resonance peak in the left side of the resonance peak; and $\Omega_2$ denotes a frequency at which vibration energy is equal to a half of vibration energy at the resonance peak in the right side of the resonance peak. In this respect, $\Omega_2\cdot\Omega_1$ is termed as a half value width.

In the case of the embodiment, the parallel resonance circuit is added to the series resonance circuit. Accordingly, the influence of the internal resistance of the variable capacitance diode D1 can be made smaller, and thus the Q factor of the variable frequency resonance circuit improves to a large extent.

That is because energy stored in the parallel resonance circuit PR during one period can be made larger than energy stored in the series resonance circuit SR during the one period at a frequency point near the resonance frequency. Accordingly, the Q factor of the overall circuit as the resonator is enhanced.

Figure 3:
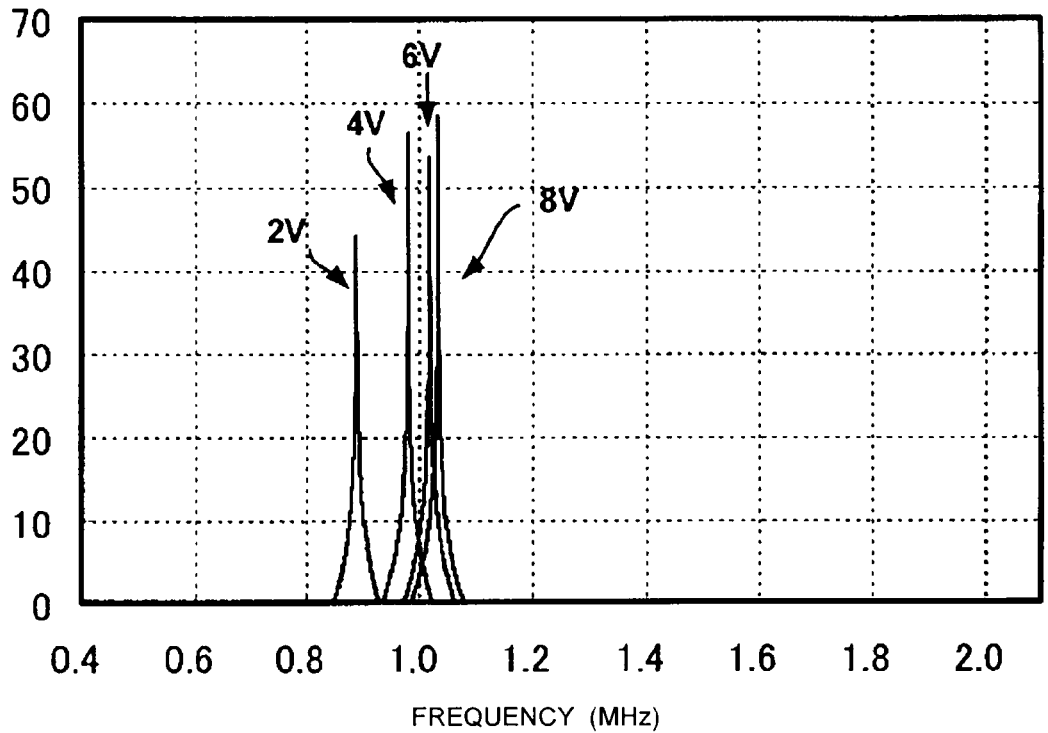
FIG. 3 shows a variable frequency characteristic of the variable frequency resonator according to the embodiment.
Figure 6:
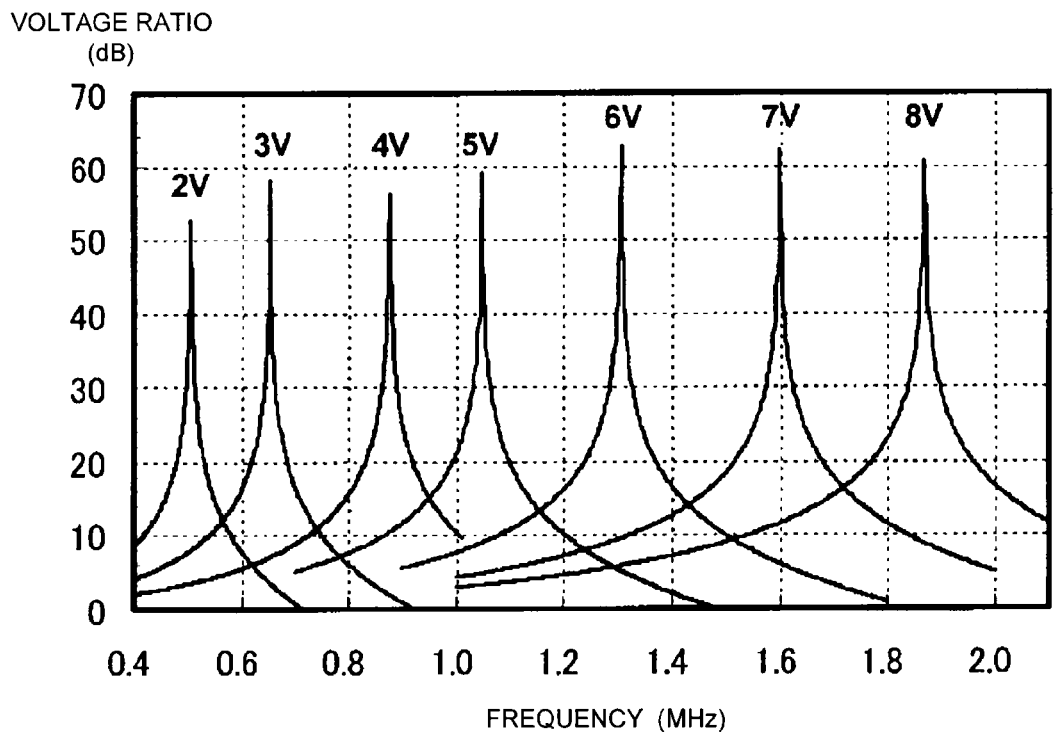
FIG. 6 shows a variable frequency characteristic of the variable frequency resonator according to the comparative example.

FIG. 3 shows a variable frequency characteristic which the variable frequency resonator shown in FIG. 1 exhibits as the reverse bias voltage VR of the controlled voltage source V2 varies from 2V to 8V. In comparison, FIG. 6 shows a variable frequency characteristic which the variable frequency resonator shown in FIG. 4 exhibits as the reverse bias voltage VR of the controlled voltage source V2 varies from 2V to 8V.

Like FIG. 2, FIG. 3 shows that the Q factor of the variable frequency resonator is enhanced by adding the parallel resonance circuit to the series resonance circuit. Moreover, FIG. 3 shows that the variable frequency width is as narrow as approximately 0.9 MHz to approximately 1.05 MHz. Thus, the variable frequency resonator can be used in a limited frequency range. In the case of the series resonator including no parallel resonance circuit, the variable frequency width is as wide as approximately 0.5 MHz to approximately 1.9 MHz, but the Q factor is low, as shown in FIG. 6. For this reason, the series resonator including no parallel resonance circuit is not suitable for use requiring a low phase noise.

Note that, although a lumped-constant circuit including the capacitor C2 and the inductor L2 is used as the parallel resonance circuit, a resonator such as a dielectric resonator may be used as well.

The variable frequency resonator according to the embodiment is capable of reducing the influence of the internal resistance of the variable capacitance diode D1 which deteriorates the Q factor of the variable frequency resonator, and accordingly enhancing the Q factor of the variable frequency resonator.

In the case of the embodiment, the cathode terminal of the variable capacitance diode D1 is connected to the ground GND. Instead, the cathode terminal may be connected to the first capacitor C1, and the anode terminal may be connected to the ground GND. In this case, the controlled voltage source V2 is arranged to have the opposite voltage polarity in order that a reverse bias voltage can be applied to the variable capacitance diode D1.

Figure 7:
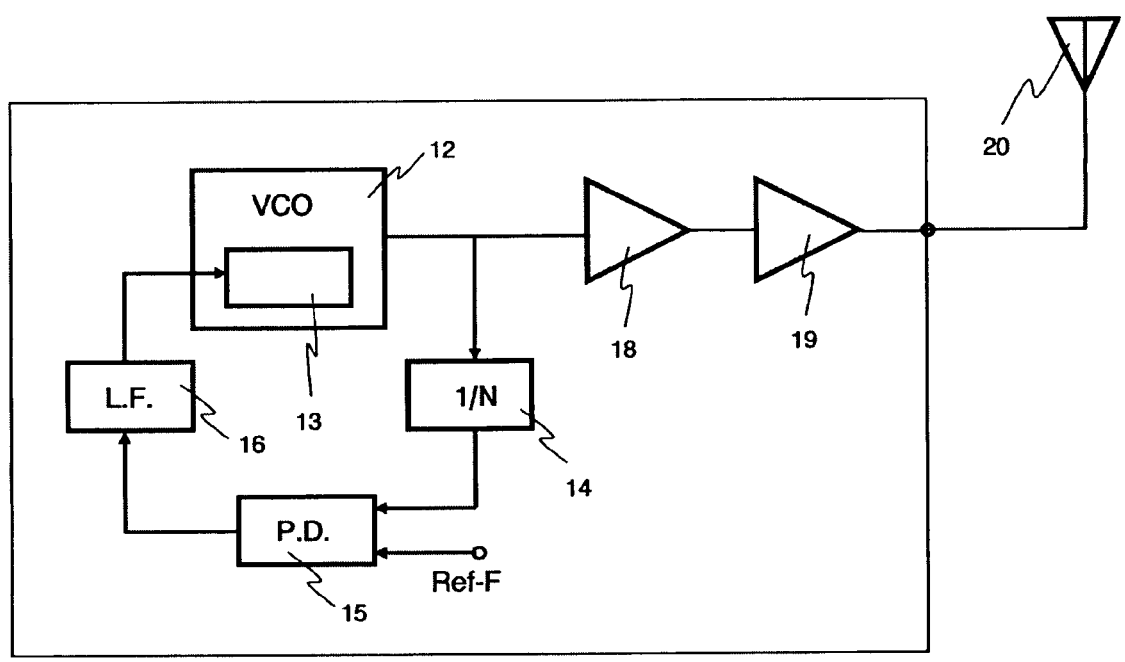
FIG. 7 is block diagram of a Doppler radar in which the variable frequency resonator according to the embodiment is used.

The above-described variable frequency resonator with the high Q factor can be used for an oscillator for a Doppler radar, for example. FIG. 7 shows an example of a block diagram of a transmitter unit of the Doppler radar. The transmitter unit of the Doppler radar includes a voltage controlled oscillator 12 whose oscillation frequency is controlled by a PPL (Phase Locked Loop). An output from the voltage controlled oscillator 12 is amplified by an amplifier 18 and an amplifier 19. As an electromagnetic wave, the thus-amplified output is transmitted from an antenna 20. The voltage controlled oscillator 12 includes a variable frequency resonator 13 according to the embodiment as the resonator of the oscillation circuit. In FIG. 7, reference numeral 14 denotes a frequency divider, reference numeral 15 denotes a phase detector, and reference numeral 16 denotes a loop filter. A reference frequency Ref-F and an output of the frequency divider 14 are inputted into the phase detector 15. The phase detector 15 outputs a voltage corresponding to a phase difference between the reference frequency Ref-F and the output of the frequency divider 14. An output of the phase detector 15 is applied to the variable capacitance diode in the variable frequency resonator 13 via the loop filter 16, and thus controls the oscillation frequency by varying the resonance frequency. The phase detector 15 and the loop filter 16 function as a controlled voltage source V2 for the variable frequency resonator 13. When the resonance frequency of the variable frequency resonator 13 is changed, a frequency-division ratio of the frequency divider 14 is changed, or a frequency of the reference frequency Ref-F is changed.

Note that although the variable frequency resonator with a resonance frequency of approximately 1 MHz has been described according to the embodiment shown in FIG. 1, a variable frequency resonator with a resonance frequency of 10 GHz, for example, is used in the oscillator for the Doppler radar. The variable frequency resonator according to the invention can be applied to variable frequency resonators with various frequencies.

While certain embodiments have been described, these embodiments have been presented by way of example only, and are not intended to limit the scope of the inventions. Indeed, the novel systems described herein may be embodied in a variety of other forms; furthermore, various omissions, substitutions and changes in the form of the systems described herein may be made without departing from the spirit of the inventions. The accompanying claims and their equivalents are intended to cover such forms or modifications as would fall within the scope and spirit of the inventions.

What is claimed is:

1. A variable frequency resonator comprising:
a series resonance circuit including
a first inductor having a first terminal connected to one end of a signal source and having a second terminal,
a first capacitor having a third terminal connected to the second terminal and having a fourth terminal, and
a variable capacitance diode to which a reverse bias voltage is applied having a fifth terminal connected to the fourth terminal and having a sixth terminal connected to the other end of the signal source; and
a parallel resonance circuit including
a second inductor having a seventh terminal and an eighth terminal, and
a second capacitor having a ninth terminal connected to the seventh terminal and having a tenth terminal connected to the eighth terminal,
wherein a connecting point between the seventh terminal and the ninth terminal is connected to a connecting point between the second terminal and the third terminal, and a connecting point between the eighth terminal and the tenth terminal is connected to the sixth terminal.

2. The variable frequency resonator according to claim 1, further comprising a controlled voltage source configured to apply the reverse bias voltage to the variable capacitance diode.

3. The variable frequency resonator according to claim 1, wherein the first capacitor cuts off the reverse bias voltage to be applied to the variable capacitance diode.

4. The variable frequency resonator according to claim 1, wherein a resonance frequency of the series resonance circuit and a resonance frequency of the parallel resonance circuit are almost equal to each other.

5. The variable frequency resonator according to claim 1, wherein the parallel resonance circuit is a dielectric resonator.

6. The variable frequency resonator according to claim 1, wherein an inductance of the first inductor is larger than an inductance of the second inductor.

7. The variable frequency resonator according to claim 1, wherein a capacitance of the variable capacitance diode is smaller than a capacitance of the second capacitor.

* * * * *